US006860945B2

(12) United States Patent
Kobayashi et al.

(10) Patent No.: US 6,860,945 B2
(45) Date of Patent: Mar. 1, 2005

(54) SUBSTRATE COATING UNIT AND SUBSTRATE COATING METHOD

(75) Inventors: Shinji Kobayashi, Kumamoto (JP);
Takahiro Kitano, Kumamoto (JP);
Masateru Morikawa, Kumamoto (JP);
Kazuhiro Takeshita, Kumamoto (JP);
Yoshiyuki Kawafuchi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 89 days.

(21) Appl. No.: 10/101,707

(22) Filed: Mar. 21, 2002

(65) Prior Publication Data

US 2002/0134304 A1 Sep. 26, 2002

(30) Foreign Application Priority Data

Mar. 22, 2001 (JP) ........................................ 2001-083565

(51) Int. Cl.⁷ ............................ B05B 15/04; B05B 3/00; B05C 5/00
(52) U.S. Cl. ........................ 118/301; 118/504; 118/321; 118/323; 118/305
(58) Field of Search ................................. 118/323, 321, 118/301, 504, 305, 505, 52, 612, 500

(56) References Cited

U.S. PATENT DOCUMENTS 5,942,035 A * 8/1999 Hasebe et al. ................ 118/52
6,416,583 B1 * 7/2002 Kitano et al. ............... 118/680

* cited by examiner

Primary Examiner—Chris Fiorilla
Assistant Examiner—Yewebdar Tadesse
(74) Attorney, Agent, or Firm—Oblon, Spivak, McClelland, Maier & Neustadt, P.C.

(57) ABSTRACT

The present invention is a coating unit for applying a coating solution to a substrate which includes: a discharge nozzle for reciprocating in a predetermined direction above the substrate and discharging the coating solution to the substrate; a holder for holding the substrate and horizontally movable in one direction perpendicular to the predetermined direction; and a cover for covering an upper face of the substrate when the substrate is moved in the one direction to be more forward than the discharge nozzle as viewed from a plane, wherein a lower face of the cover is inclined such as to be higher on the discharge nozzle side. According to the present invention, the cover covering the upper face of the substrate restrains a solvent from evaporating from the coating solution applied on the substrate to secure flatness of a coating film.

13 Claims, 16 Drawing Sheets

SUBSTRATE COATING UNIT AND SUBSTRATE COATING METHOD

BACKGROUND OF THE INVENTION

1. Field of the Invention

The present invention relates to a substrate coating unit and a substrate coating method.

2. Description of the Related Art

In a photolithography process, for example, in semiconductor device fabrication processes, a resist coating treatment for applying a resist solution to a wafer surface to form a resist film thereon, an exposure processing for exposing a pattern on the wafer, a developing treatment for developing the wafer after the exposure, and so on are performed to form a predetermined circuit pattern on the wafer.

In these days, in the resist coating treatment, a spin coating method is frequently employed in which the resist solution is discharged onto a center of a rotated wafer to diffuse the resist solution over the wafer surface.

However, in the spin coating method, the wafer is rotated at a high speed, which causes a large amount of the resist solution to scatter from the peripheral portion of the wafer, resulting in much waste resist solution. Further, there is a disadvantage that a unit for the coating is contaminated by the scattered resist solution, and thus the unit needs to be cleaned frequently, and so on.

Hence, in place of the spin coating method of rotating the wafer, what can be proposed is a coating method of applying the resist solution in a manner of so-called drawing with one stroke of discharging the resist solution from a resist solution discharge part while relatively moving the wafer and the resist solution discharge part to apply it, for example, in a rectangular wave form evenly over the wafer. In this coating method of so-called drawing with one stroke, for example, the resist solution discharge part discharges the resist solution while reciprocating in a Y-direction above the wafer and the wafer is moved by a small distance in an X-direction every return of the resist solution discharge part to thereby shift a coating position, so that the resist solution is applied on the entire surface of the wafer.

Meanwhile, in the coating method in a manner of so-called drawing with one stroke, for example, a resist solution with a low viscosity is used and the resist solution is linearly applied on the wafer. However, the resist solution, if left as it is, heaps up along an application path, and thus the resist solution needs to be diffused over the entire face of the wafer after the application. Therefore, in order to keep the resist solution having a low viscosity, it becomes necessary to cover the wafer, for example, with a cover so that a solvent in the resist solution will not evaporate. Moreover, in order to effectively restrain the evaporation of the solvent, it is desirable to locate the cover as close as possible to the wafer.

However, when the cover is provided above the wafer and the wafer is moved in the X-direction, an air current flowing in the X-direction is formed between the wafer and the cover. Further, since the air current has a velocity gradient due to the influence of the cover and a shearing stress is generated on the wafer surface by the velocity gradient, the application state of the resist solution immediately after the application might be disturbed by the shearing stress. Furthermore, it is also feared that the shearing stress increases as the cover is brought closer to the wafer to lose the flatness of the resist solution. If the flatness of the resist solution is lost as described above, a resist film having a uniform film thickness is not formed on the wafer, resulting in a decrease in yield.

SUMMARY OF THE INVENTION

The present invention is made in view of the above points, and it is an object of the present invention to provide a substrate coating unit and a substrate coating method for, when a coating solution such as a resist solution or the like is applied in a manner of so-called drawing with one stroke, securing flatness of the coating solution while restraining evaporation of a solvent of the coating solution applied on a substrate such as a wafer or the like.

In order to attain the above object, a coating unit of the present invention comprises: a discharge nozzle for reciprocating in a predetermined direction above the substrate and discharging the coating solution to the substrate; a holder for holding the substrate and horizontally movable in one direction perpendicular to the predetermined direction; and a cover for covering an upper face of the substrate when the substrate is moved in the one direction to be more forward than the discharge nozzle as viewed from a plane, wherein a lower face of the cover is inclined such as to be higher on the discharge nozzle side.

Further, according to another aspect, a coating unit of the present invention comprises: a discharge nozzle for reciprocating in a predetermined direction above the substrate and discharging the coating solution to the substrate; a holder for holding the substrate and horizontally movable in one direction perpendicular to the predetermined direction; and a cover for covering an upper face of the substrate when the substrate is moved in the one direction to be more forward than the discharge nozzle as viewed from a plane, wherein a lower face of the cover is inclined such as to be lower on the discharge nozzle side.

According to still another aspect, a coating unit of the present invention comprises: a discharge nozzle for reciprocating in a predetermined direction above the substrate and discharging the coating solution to the substrate; a holder for holding the substrate and horizontally movable in one direction perpendicular to the predetermined direction; a cover for covering an upper face of the substrate; and a cover moving device for moving the cover in a direction perpendicular to the predetermined direction.

A coating method of the present invention comprises the steps of: a discharge nozzle applying the coating solution onto the substrate while moving in a predetermined direction above the substrate; moving the substrate by a predetermined distance in one direction perpendicular to the predetermined direction when the discharge nozzle reaches an outside of the substrate; thereafter, the discharge nozzle applying the coating solution onto the substrate while moving in an opposite direction to the predetermined direction above the substrate; moving a cover for covering an upper face of the substrate in the same one direction as the substrate when the substrate is moved in the one direction; and moving the cover to an original position of the cover before the movement when the discharge nozzle applies the coating solution to the substrate while moving in the opposite direction to the predetermined direction.

With the coating unit of the present invention, it is possible, first of all, to conduct the coating method in a manner of so-called drawing with one stroke of relatively moving the substrate and the discharge nozzle to apply the coating solution in a rectangular form evenly over the substrate since the coating unit has the discharge nozzle capable of reciprocating in the predetermined direction above the substrate and the holder for the substrate movable in the one direction perpendicular to the predetermined direction. Further, the cover covering the upper face of the substrate restrains the solvent from evaporating from the coating solution applied on the substrate to keep a low viscosity of the coating solution. Furthermore, since the cover is made higher on the discharge nozzle side, a wide gap is formed between the substrate and the cover when the substrate immediately after application is moved in the one direction. Thereby, when an air current occurs accompanying the movement of the substrate, it is possible to restrain the coating solution from being disturbed by the air current, so that the flatness of the coating solution is secured accordingly.

As described above, it is feared that when the substrate is moved, the coating solution on the substrate is drawn backward with respect to the direction of movement by a shearing stress due to a velocity gradient of the air current, resulting in the coating solution on the substrate becoming thinner on the movement direction side. In the present invention, however, a wide gap is provided between the substrate and the cover, which restrains a large shearing stress from occurring on the surface of the substrate immediately after the application to thereby restrain the coating solution from becoming thinner only on the movement direction side. Thereby, evenness in thickness of the coating solution is secured within a substrate plane. Further, since the cover is provided at an angle, the gap between the substrate and the cover narrows as the substrate advances in the one direction, so that excessive evaporation of the solvent in the coating solution can be restrained.

Further, if the cover is lowered on the discharge nozzle side, when the substrate immediately after the application is moved in the one direction, a narrow gap is formed between the substrate and the cover. Then, a shear flow formed in the gap by the movement of the substrate causes a shearing stress on the surface of the coating solution, so that the coating solution can be flattened by the shearing stress. Particularly when the coating solution is applied in a manner of so-called drawing with one stroke, a heap of the coating solution is formed along the application path immediately after the application, but the coating solution is flattened by the shear flow, resulting in improved flatness of the coating solution.

The lower face of the aforementioned cover may be curved. By thus curving the lower face of the cover, an air current between the substrate and the cover smoothly flows along the curved face to stable the behavior of the air current. This stables the coating solution which is susceptible to the air current, resulting in the formation of an appropriate coating film on the substrate.

In the present invention, it is also preferable that the cover has a flat plate shape with a uniform thickness and a cover raising and lowering mechanism for raising and lowering a part of the cover is provided. The cover can be raised and lowered by a predetermined distance to be inclined by the cover raising and lowering mechanism. Further, by adjusting the raising and lowering distance, an inclined angle of the cover can be adjusted, so that the distance of the gap between the substrate and the cover becomes adjustable. Therefore, the distance is preferably adjusted based on the film thickness, which makes it possible to restrain the evaporation of the solvent from the coating solution to a minimum while restraining the influence of the air current.

The cover raising and lowering mechanism may be configured to raise and lower portions in vicinities of both ends along the one direction of the cover. By raising and lowering both ends of the cover, the raising and lowering distance of both ends can be adjusted to adjust the inclined angle of the cover. Further, since the whole cover can be moved up and down by raising and lowering both ends of the cover at both sides, the distance of the gap between the substrate and the cover can be changed. By changing the distance of the gap, the air current formed between the substrate and the cover can be controlled. Therefore, it is possible to secure the flatness of the coating solution while restraining the evaporation of the solvent of the coating solution on the substrate by adjusting the distance of the gap in accordance with the type of the coating solution, the film thickness, and the moving speed of the substrate.

According to the coating method of the present invention, when the substrate is shifted in the one direction, the cover is also moved in the same direction, so that the air current formed between the substrate and the cover by the movement of the substrate decreases in velocity gradient. This reduces the influence of the air current exerted upon the coating solution on the substrate, so that the behavior of the coating solution stables to secure the flatness of the coating solution. Further, the cover is moved to its original position while the discharge nozzle is discharging the coating solution onto the substrate, which prevents a large amount of solvent from evaporating due to the cover deviating from a position above the substrate, so that a space for moving the cover is reduced to a minimum.

DETAILED DESCRIPTION OF THE PREFERRED EMBODIMENTS

Figure 1:
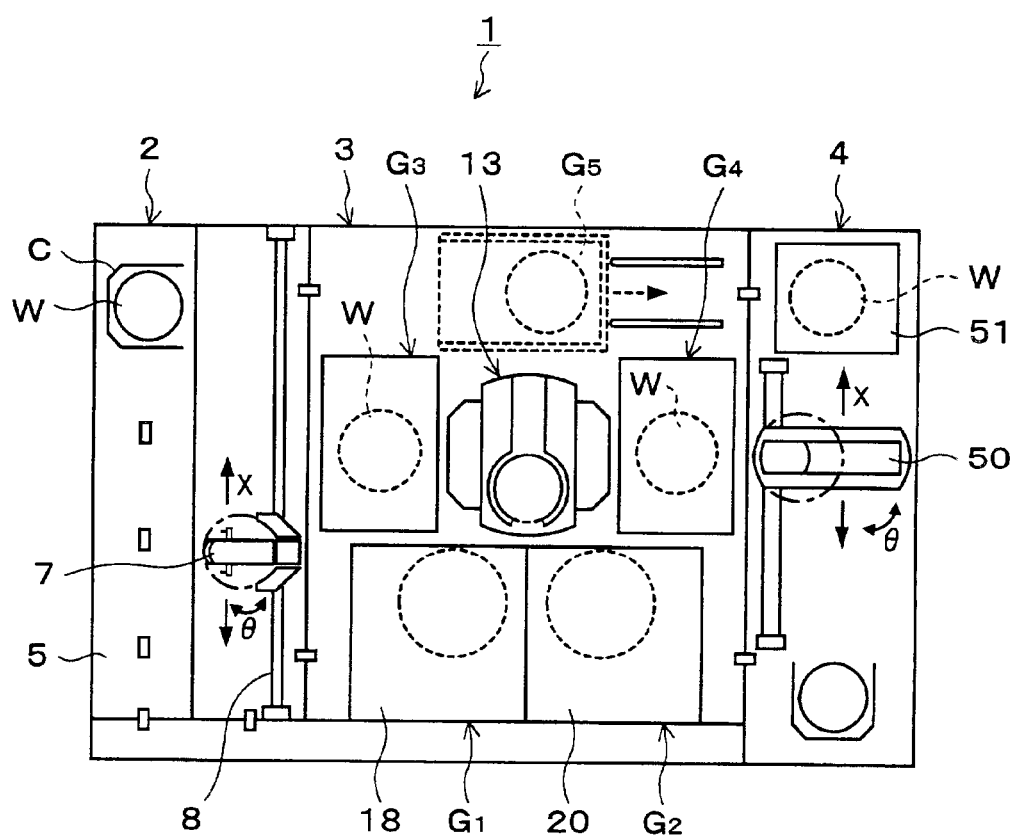
FIG. 1 is a plane view showing a schematic configuration of a coating and developing treatment system including a resist coating unit according to an embodiment.
Figure 2:
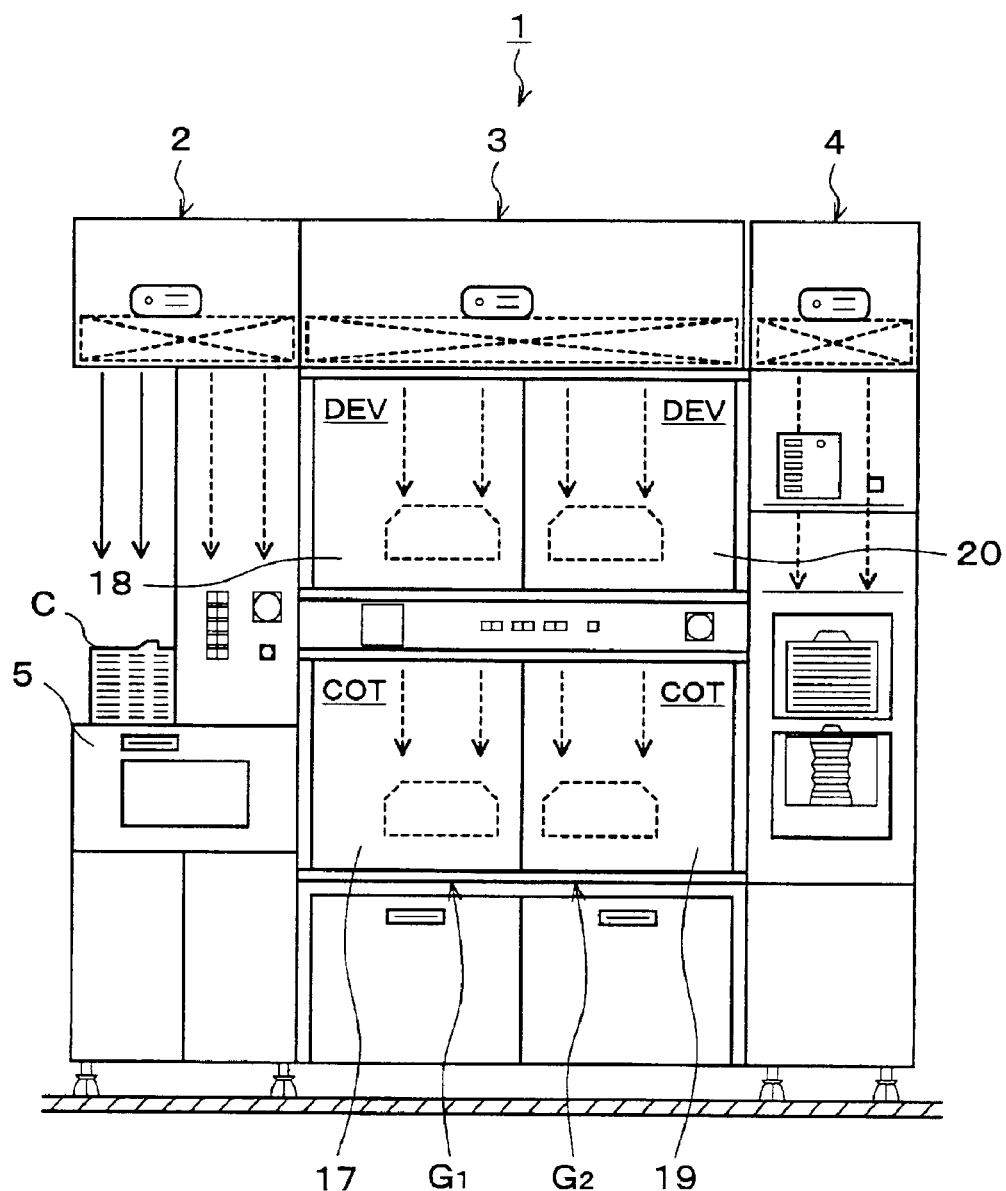
FIG. 2 is a front view of the coating and developing treatment system in FIG. 1.
Figure 3:
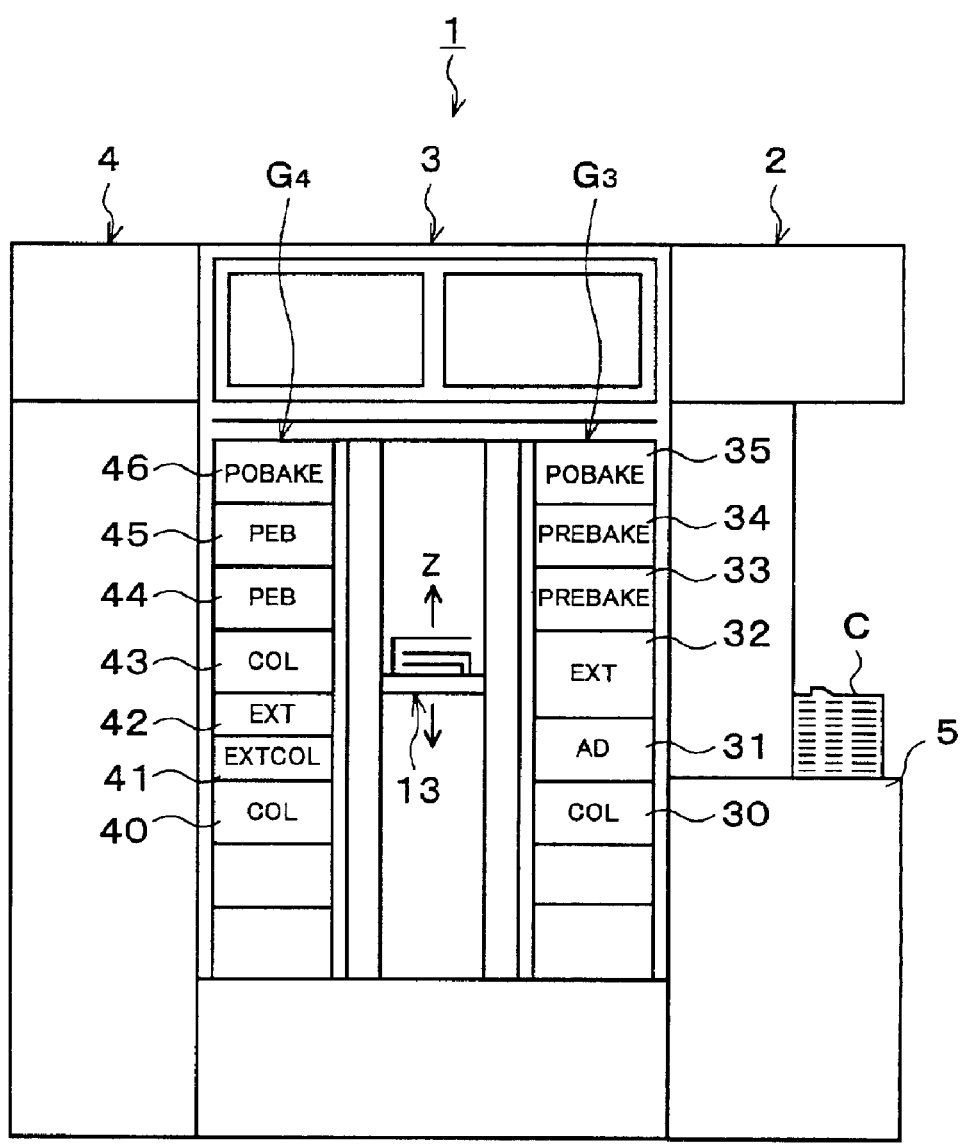
FIG. 3 is a rear view of the coating and developing treatment system in FIG. 1.

Hereinafter, preferred embodiments of the present invention will be explained to detail the present invention. FIG. 1 is a schematic plane view of a coating and developing treatment system 1 including a substrate coating unit according to an embodiment, FIG. 2 is a front view of the coating and developing treatment system 1, and FIG. 3 is a rear view of the coating and developing treatment system 1.

As shown in FIG. 1, the coating and developing treatment system 1 has a configuration in which a cassette station 2 for carrying, for example, 25 wafers W in a unit of cassette from/to the outside to/from the coating and developing treatment system 1 and for carrying the wafers W to/from a cassette C, a processing station 3 composed of various kinds of processing units which are disposed in multi-tiers, for performing predetermined processing for the wafers W one by one in coating and developing processes, and an interface section 4 for delivering/receiving the wafers W to/from a not-shown aligner which is provided adjacent to the processing station 3 are integrally connected.

In the cassette station 2, a plurality of the cassettes C are mountable in predetermined positions on a cassette mounting table 5, which serves as a mounting portion, in a line in an X-direction (a vertical direction in FIG. 1). Furthermore, a wafer carrier 7, which is transportable in the alignment direction of the cassettes (the X-direction) and in an alignment direction of the wafers W housed in the cassette C (a Z-direction; a vertical direction), is provided to be movable along a carrier path 8 so that it can selectively access to each of the cassettes C.

The wafer carrier 7 has an alignment function for aligning the wafers W. The wafer carrier 7 is also configured to be able to access to an extension unit 32 included in a third processing unit group G3 on the processing station 3 side as will be described below.

In the processing station 3, a main carrier 13 is provided in a center part thereof, and various kinds of the processing units are multi-tiered on a periphery of the main carrier 13 to constitute processing unit groups. In the coating and developing treatment system 1, where four processing unit groups G1, G2, G3 and G4 are arranged, the first and second processing unit groups G1 and G2 are disposed on a front side of the coating and developing treatment system 1, the third processing unit group G3 is disposed adjacent to the cassette station 2, and the fourth processing unit group G4 is disposed adjacent to the interface section 4. Furthermore, a fifth processing unit group G5 depicted by a broken line is allowed to be additionally disposed on a rear side as an option. The main carrier 13 is capable of carrying the wafers W to/from the later described various kinds of processing units which are disposed in these processing unit groups G1, G2, G3, G4 and G5. Incidentally, the number and the arrangement of the processing unit groups vary depending on the kind of processing performed on the wafers W, and the number of the processing unit groups is arbitrarily selected if it is one or more.

In the first processing unit group G1, for example, as shown in FIG. 2, a resist coating unit 17 as a coating unit according to the present invention and a developing unit 18 for developing the wafer W after exposure are two-tiered in the order from the bottom. Similarly, in the processing unit group G2, a resist coating unit 19 and a developing unit 20 are two-tiered in the order from the bottom.

In the third processing unit group G3, for example, as shown in FIG. 3, a cooling unit 30 for cooling the wafer W, an adhesion unit 31 for enhancing adhesion between a resist solution and the wafer W, the extension unit 32 for delivering/receiving the wafer W, pre-baking units 33 and 34 for evaporating a solvent in the resist solution, and a post-baking unit 35 for performing a heat treatment after a developing treatment are, for example, six-tiered in the order from the bottom.

In the fourth processing unit group G4, for example, a cooling unit 40, an extension and cooling unit 41 for spontaneously cooling the wafer W mounted thereon, an extension unit 42, a cooling unit 43, post-exposure baking units 44 and 45 each for performing a heat treatment after exposure, and a post-baking unit 46 for performing a heat treatment after a developing treatment are, for example, seven-tiered in the order from the bottom.

In a center part of the interface section 4, a wafer carrier 50 is provided. The wafer carrier 50 is configured to be freely movable in the X-direction (the vertical direction in FIG. 1) and the Z-direction (the perpendicular direction), and to be freely rotatable in a θ-direction (a direction of rotation about the Z-axis), so that it can access to the extension and cooling unit 41 and the extension unit 42 included in the fourth processing unit group G4, an edge exposure unit 51, and the not-shown aligner to carry the wafer W to each of them.

Figure 4:
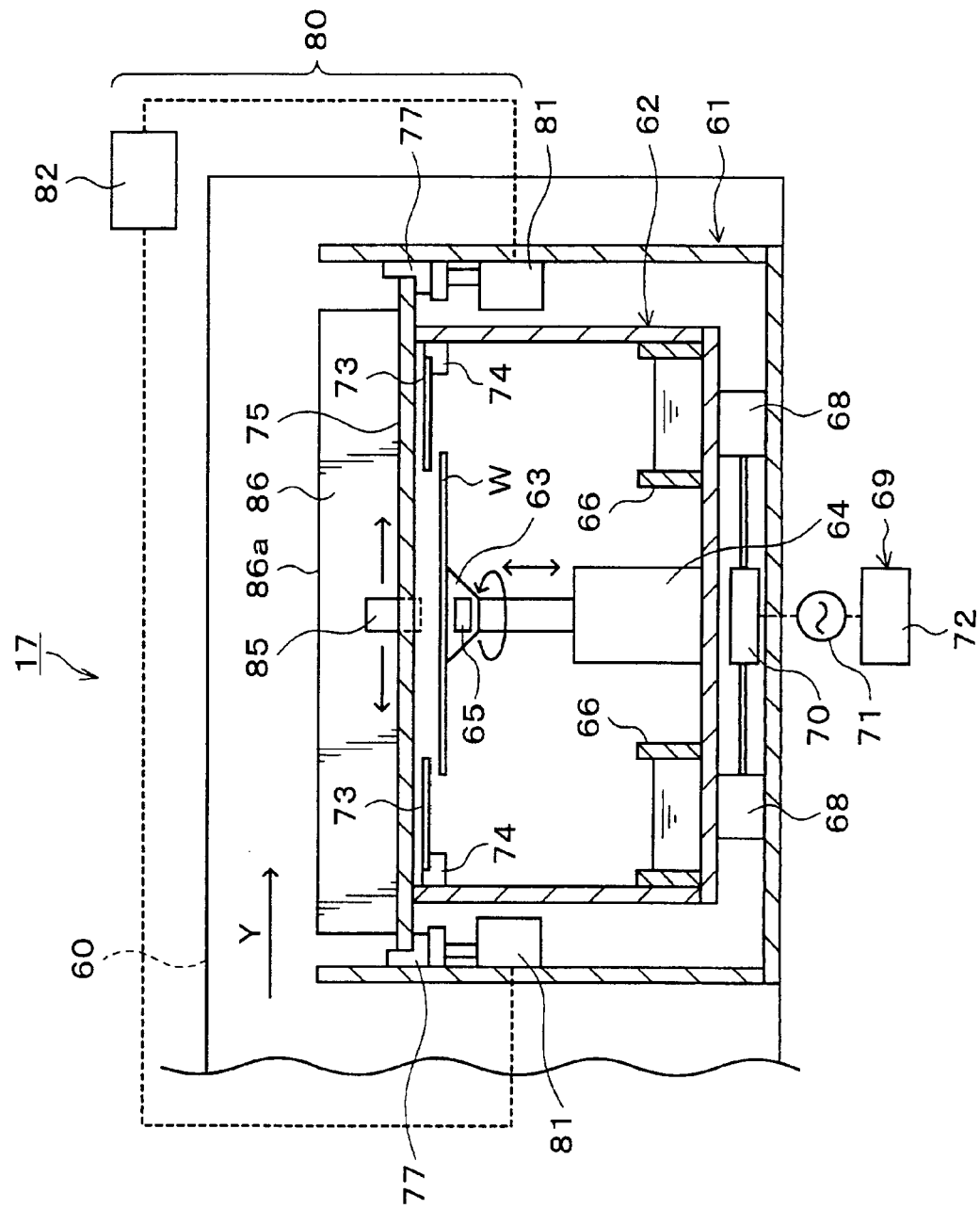
FIG. 4 is an explanatory view of a vertical cross section showing a configuration of the resist coating unit.

Next, a configuration of the above-described resist coating unit 17 is explained. FIG. 4 is an explanatory view of a vertical cross section showing a schematic configuration of the resist coating unit 17, and FIG. 5 is an explanatory view of a horizontal cross section showing the schematic configuration of the resist coating unit 17.

Figure 5:
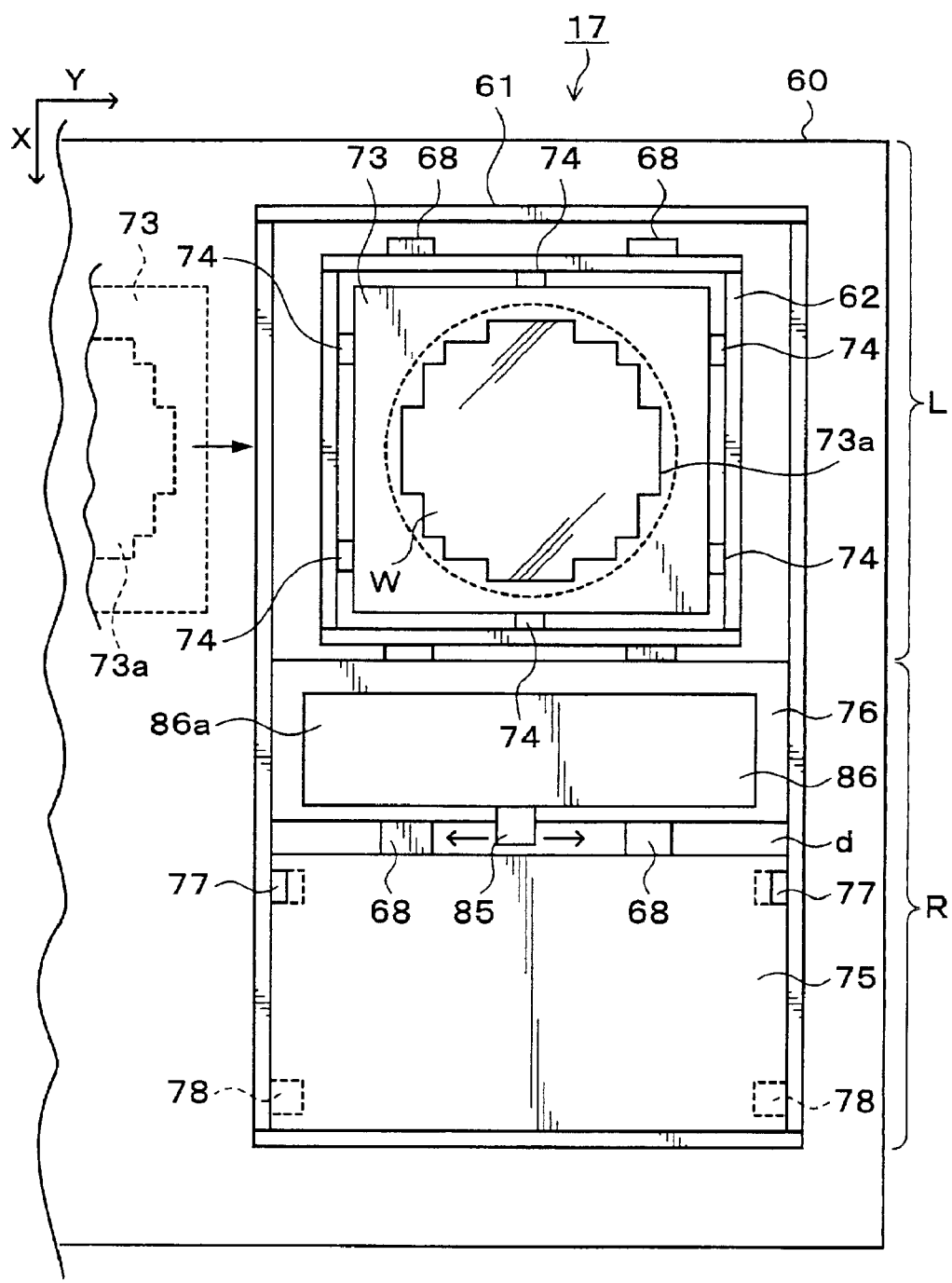
FIG. 5 is an explanatory view of a horizontal cross section showing the configuration of the resist coating unit.

In a casing 60 of the resist coating unit 17, as shown in FIG. 4 and FIG. 5, an outer container 61 is provided which is formed in a substantially box shape elongated in the X-direction (the vertical direction in FIG. 5) with the upper face open. The outer container 61 has a carriage section L where the wafer W is carried in/out and a processing section R where coating of the wafer W is performed. The processing section R is located on a positive direction side in the X-direction and the carriage section L is located on a negative direction side in the X-direction.

In the outer container 61, an inner container 62 is provided which is formed in a substantially box shape with the upper face open and accommodates the wafer W. In a center part of the inner container 62, a holder 63 for holding the wafer W by sucking it is provided. Under the holder 63, a driver 64 provided with a motor, a cylinder, and so on is provided to enable the holder 63 to ascend and descend. Thereby, the holder 63 can ascend and descend when the wafer W is carried in and receive the wafer W preferably from the main carrier 13. Further, the holder 63 is rotatable by the driver 64 so as to rotate the wafer W held by the holder 63 for alignment. For example, an ultrasonic vibrator 65 is attached to the holder 63 and can vibrate the holder 63 at a high frequency to even the resist solution applied on the wafer W by vibration. At the inner bottom of the inner container 62, solvent tanks 66 are provided which store a solvent for the resist solution. This makes it possible to keep the inside of the inner container 62 in a solvent atmosphere.

At the inner bottom of the outer container 61, rails 68 are provided which extend in the longitudinal direction (the X-direction), and the inner container 62 is provided on the rails 68 to be freely movable. The rails 68 are provided with an inner container moving mechanism 69 for making the inner container 62 movable. The inner container moving mechanism 69 is constituted by an inner container driver 70 provided with a motor or the like for moving the inner container 62 by electric power, a power supply 71 for supplying electric power to the inner container driver 70, and an inner container controller 72 for adjusting the power supply to control the inner container driver 70. Thereby, the inner container 62 becomes movable between the carriage section L and the processing section R along the rails 68. Further, since the inner container 62 can move a predetermined distance at a predetermined timing during the application, the holder 63 in the inner container 62, accompanying the movement, becomes horizontally movable intermittently toward the positive direction side in the X-direction as one direction.

As shown in FIG. 5, a mask member 73 for covering the wafer W during the application to limit a coating range of the wafer W is kept waiting, for example, in a not shown cleaning section located outside the outer container 61 on the negative direction side in the X-direction. The mask member 73 has a flat plate shape having an opening 73a corresponding to the coating range at the center part thereof.

The mask member 73 is configured to be movable by a not shown carrier to a position above the wafer W in the inner container 62. Inner walls of the inner container 62 are provided with mask supporting members 74 for supporting the mask member 73 at a position above the wafer W. This configuration makes it possible to carry the mask member 73 kept waiting in the not shown cleaning section into the inner container 62 after the wafer W is held by the holder 63 and to mount the mask member 73 on the mask supporting members 74 above the wafer W. Thereby, a resist solution discharged from above by a discharge nozzle 85 as a later-described discharge nozzle can be applied only to a predetermined range of the wafer W, and the resist solution which is discharged to the outside of the range can be blocked by the mask member 73 and collected.

On the processing section R side of the outer container 61, covers 75 and 76 are provided, as shown in FIG. 5, each in a plate shape for covering the upper face of the wafer W during the application. Each of the covers 75 and 76 is formed in a quadrangle as viewed from a plane to fit the shape of the opening of the outer container 61. The cover 75 and the cover 76 are provided, side by side, on the positive direction side in the X-direction and on the negative direction side in the X-direction, respectively. Between the covers 75 and 76, a gap d is provided so that the later-described discharge nozzle 85 can reciprocate in the Y-direction within the gap d and discharge the resist solution to the wafer W located thereunder. Further, the covers 75 and 76 are provided such that there is little or no gap with respect to the upper end of the inner container 62, so that when the inner container 62 is located under the inner the covers 75 and 76, the inside of the inner container 62 can be maintained in a predetermined atmosphere. In this embodiment, the cover 75 corresponds to a cover according to the present invention.

The cover 75 is supported by supporting members 77 and 78 which are provided on inner walls of the outer container 61. The supporting members 77 are disposed on the negative direction side in the X-direction of the cover 75, and the supporting members 78 are disposed on the positive direction side in the X-direction of the cover 75.

The cover 75 is configured to be freely ascendable and descendable by a cover raising and lowering mechanism 80 as shown in FIG. 4. The cover raising and lowering mechanism 80 has raising and lowering drivers 81 each including a cylinder or the like for raising and lowering the supporting member 77, and a controller 82 for controlling actions of the raising and lowering drivers 81. The raising and lowering drivers 81 support lower parts of the supporting members 77 and can move the supporting members 77 in the vertical direction. This allows the supporting members 77 to ascend by a predetermined distance to thereby incline the cover 75 to be higher on the negative direction side in the X-direction.

The aforementioned discharge nozzle 85 is provided to be located within the gap d. The discharge nozzle 85 is configured to be movable in the Y-direction by a nozzle moving mechanism 86 which is provided on the cover 76 of the outer container 61.

Figure 6:
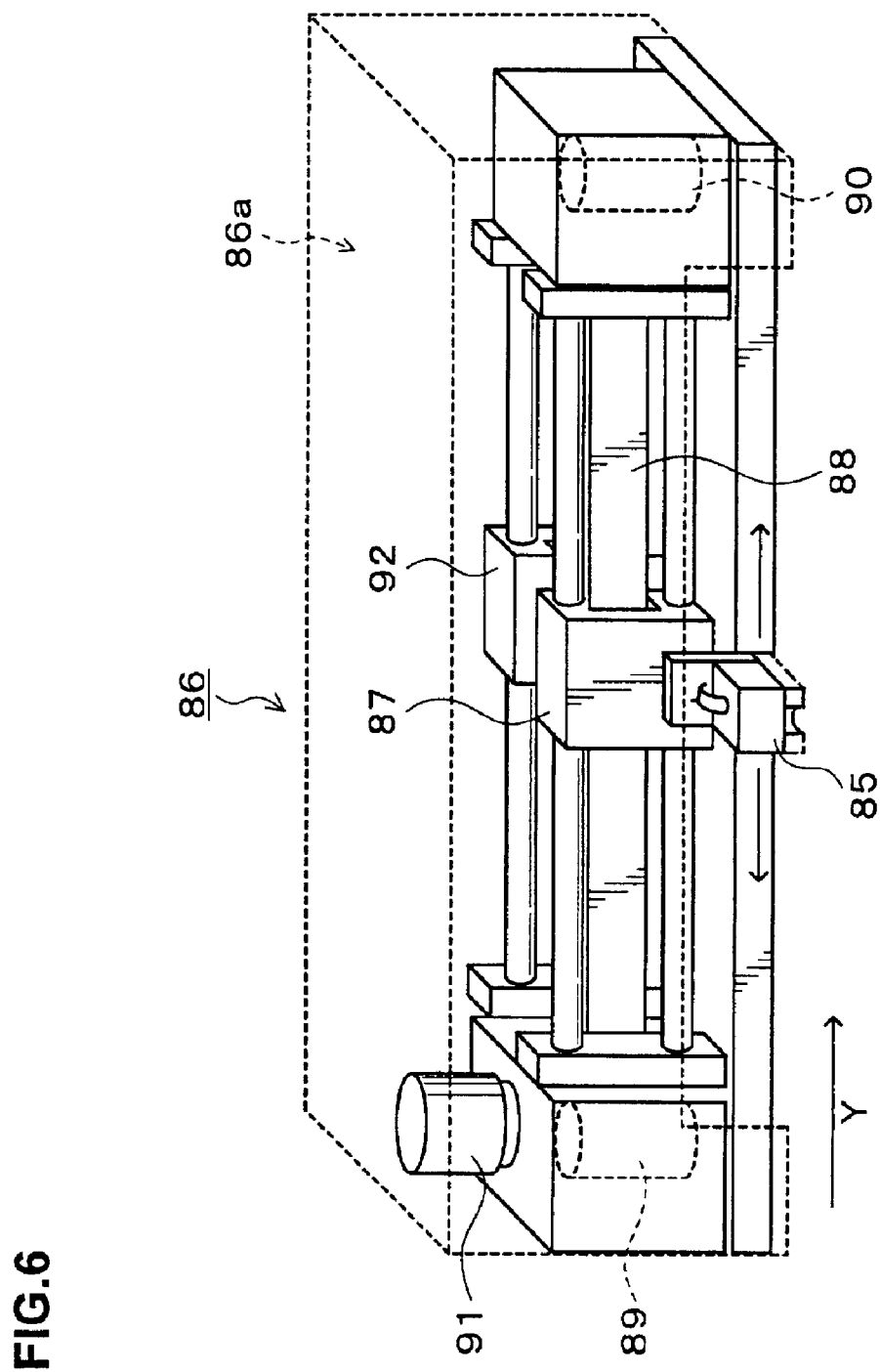
FIG. 6 is a perspective view showing a configuration of a nozzle moving mechanism.

The nozzle moving mechanism 86 is covered with a case 86a as shown in FIG. 6, and a slider 87 for holding and sliding the discharge nozzle 85 is provided in the case 86a. The slider 87 is provided fixed to a part of a driving belt 88 extending in the Y-direction. Further, the driving belt 88 is looped between a driving pulley 89 and a driven pulley 90 which are provided on both sides in the Y-direction of the outer container 61, respectively. The driving pulley 89 is normally/reversely rotated by a rotation drive motor 91. This configuration makes it possible that the rotation drive motor 91 rotates the driving pulley 89 to move the driving belt 88, which causes the slider 87 to slide in the Y-direction, thereby allowing the discharge nozzle 85 to reciprocate within the gap d.

The driving belt 88 is provided with, on the side where the discharge nozzle 85 is not held, a balance weight 92 which balances with the slider 87 in weight to restrain, to a minimum, a swing occurring during the movement of the slide 87.

According to the above configuration, the discharge nozzle 85 above the wafer W discharges the resist solution onto the wafer W while reciprocating in the Y-direction, and the inner container 62 intermittently moves in the positive direction of the X-direction, so that the resist solution can be applied to the surface of the wafer W in a manner of so-called drawing with one stroke.

Next, operations of the resist coating unit 17 configured as above are explained together with steps of a photolithography process which are performed in the coating and developing treatment system 1.

First of all, the wafer carrier 7 takes out one unprocessed wafer W from the cassette C and carries it to the extension unit 32 which is included in the third processing unit group G3. Then, the wafer W is carried by the main carrier 13 into the adhesion unit 31, where, for example, HMDS for enhancing adhesion to the resist solution is applied onto the wafer W. The wafer W is then carried to the cooling unit 30 and cooled to a predetermined temperature. The wafer W which has been cooled to the predetermined temperature is carried to, for example, the resist coating unit 17 by the main carrier 13.

The wafer W coated with the resist solution in the resist coating unit 17 is carried to the pre-baking unit 33 where the wafer W is heat treated. Subsequently, the wafer W is carried to the extension and cooling unit 41 and cooled. Then, the wafer W is taken out of the extension and cooling unit 41 by the wafer carrier 50 and thereafter carried via the edge exposure unit 51 to the aligner (not shown) where a predetermined pattern is exposed on the wafer W. The wafer W for which the exposure processing has been finished is carrier to the extension unit 42 by the wafer carrier 50 and then carried to the post-exposure baking unit 44 by the main carrier 13. The wafer W is heat treated and then carried to the cooling unit 43 where it is subjected to a cooling treatment.

The wafer W for which the cooling treatment has been finished is carried to the developing unit 18 by the main carrier 13 and subjected to a developing treatment. Thereafter, the wafer W is carried to the post-baking unit 46 and the cooling unit 30 in sequence to undergo predetermined processing in each unit. Then, the wafer W is returned to the cassette C via the extension unit 32, whereby a series of coating and developing processes is finished.

Next, the above-described operations of the resist coating unit 17 are explained in detail. First of all, when the wafer W is carried to the resist coating unit 17, the inner container 62 is waiting at the carriage section L on the negative direction side in the X-direction. Then, the wafer W for which the pre-process has been completed is carried into the inner container 62 by the main carrier 13 and delivered to the holder 63 which has been raised and is waiting in advance. The wafer W delivered to the holder 63 is suction held by the holder 63 and lowered to a predetermined height by the driver 64. The wafer W in this event is located such that, for example, when the wafer W is moved to the processing section R side, gaps between the wafer W and the covers 75 and 76 are about 4 mm.

Figure 7:
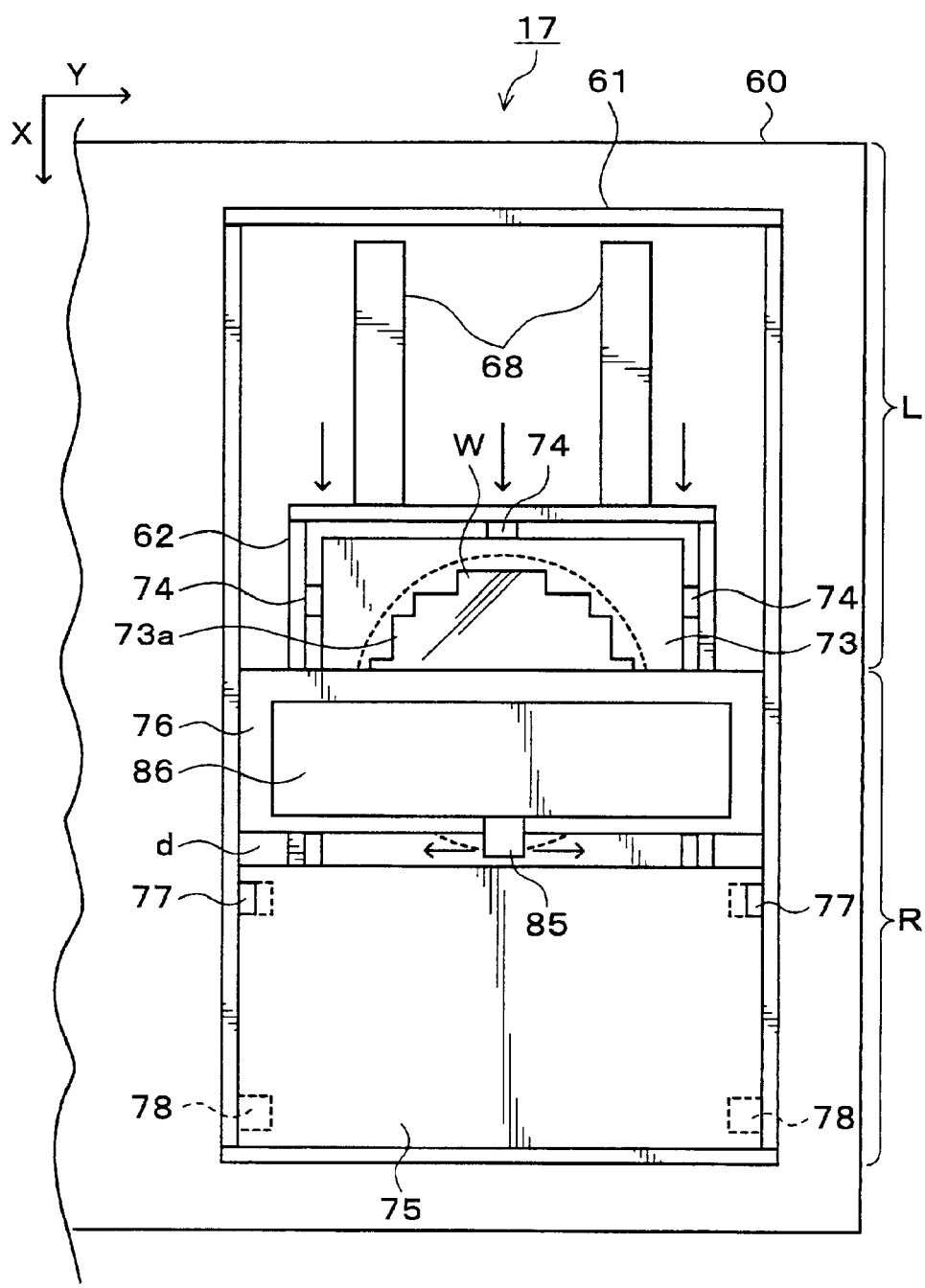
FIG. 7 is an explanatory view of a horizontal cross section showing the configuration of the resist coating unit when an inner container moves to a processing section R side.

Thereafter, a not shown alignment mechanism detects a notch or an orientation flat of the wafer W, and based on the detection the holder 63 is rotated to position the wafer W at a predetermined position. Then, the mask member 73 which is kept waiting at the not shown cleaning section is carried from outside the outer container 61 into the inner container 62 and mounted on the mask supporting members 74. In this event, the inner container 62 is in a state of being covered with the mask member 73, so that the solvent atmosphere in the inner container 62 is maintained also by the mask member 73. Subsequently, as shown in FIG. 7, the inner container 62 is moved in the positive direction of the X-direction by the inner container moving mechanism 69 and stopped at a position where an end portion of the wafer W on the positive direction side in the X-direction is positioned under the discharge nozzle 85.

Figure 8:
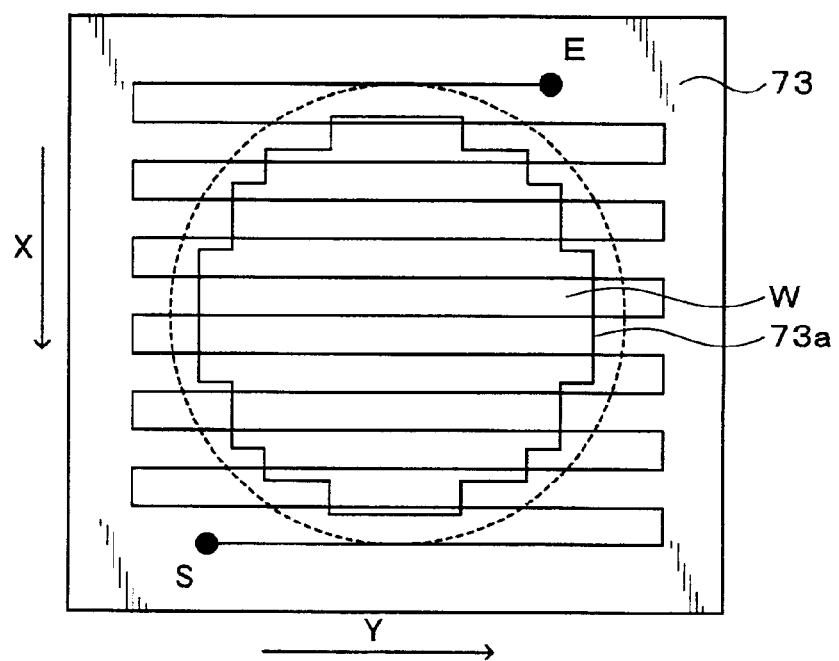
FIG. 8 is an explanatory view showing a path of application of a resist solution.
Figure 9:
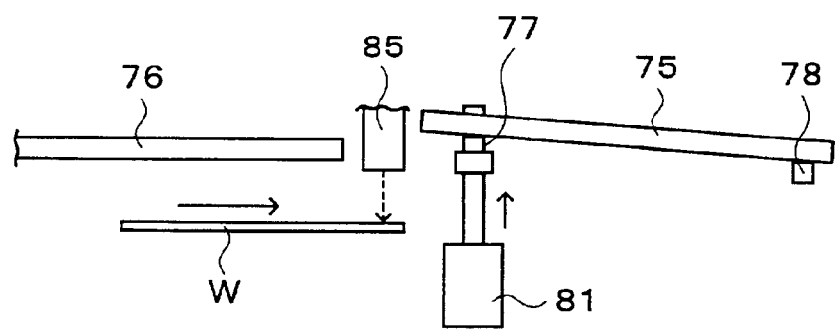
FIG. 9 is an explanatory view of an outer container schematically showing, from a side, the state where a cover is raised.

Then, the discharge nozzle 85 is moved by the nozzle driving mechanism 86 to a start position S where application is started, that is, a position outside the wafer W on the negative direction side in the Y-direction as shown in FIG. 8. In this event, as shown in FIG. 9, the supporting members 77 which are located on the discharge nozzle 85 side of the cover 75 are raised by the raising and lowering drivers 81, which causes the cover 75 to incline, so as to widen the gap between the cover 75 on the discharge nozzle side 85 and the wafer W.

Subsequently, application of the resist solution is started in a manner of so-called drawing with one stroke. A resist coating step in this case is explained with reference to FIG. 8. First, the discharge nozzle 85 discharges a linear resist solution to the surface of the wafer W while moving in the positive direction of the Y-direction from the start position S at a predetermined speed. Then, the discharge nozzle 85 advances to the outside of the wafer W on the positive direction side in the Y-direction and once stops above the mask member 73. The resist solution is kept discharged in this event, and a resist solution discharged to a place other than the wafer W is received by the mask member 73 and collected.

Subsequently, the inner container 62 is shifted in the positive direction of the X-direction by a predetermined distance by the inner container moving mechanism 69, so that the wafer W is also shifted in the positive direction of the X-direction. In this event, accompanying the movement of the wafer W, an air current flowing in the positive direction of the X-direction is formed in the gap between the wafer W and the cover 75. However, since the gap of, for example, 4 mm or more is provided between the wafer W and the cover 75 and further the wider gap is provided on the discharge nozzle 85 side, influence by the air current is restrained to a minimum.

Thereafter, the discharge nozzle 85 returns and moves in the negative direction of the Y-direction while continuously applying the resist solution, and advances to the outside of the wafer W and stops. Then, the wafer W is shifted by a predetermined distance in the positive direction of the X-direction, and the discharge nozzle 85 again returns and advances in the positive direction of the Y-direction to discharge the resist solution onto the wafer W.

After the above steps are repeated, when the discharge nozzle 85 reaches an END position E shown in FIG. 8, the discharge of the resist solution is stopped, whereby the resist coating is completed. Thereby, the resist solution is applied on the wafer W in a rectangular wave form, the resist solution being applied on the entire surface of the wafer W.

Subsequently, the ultrasonic vibrator 65 which is attached to the holder 63 vibrates the wafer W to even and flatten the resist solution on the wafer W.

Thereafter, the inner container 62 is moved to the carriage section L side, and the mask member 73 is carried out from the inside of the outer container 61. Then, the wafer W is delivered from the holder 63 in the inner container 62 to the main carrier 13, and the wafer W is carried out of the resist coating unit 17, whereby a series of processes in the resist coating unit 17 is completed.

Figure 10:
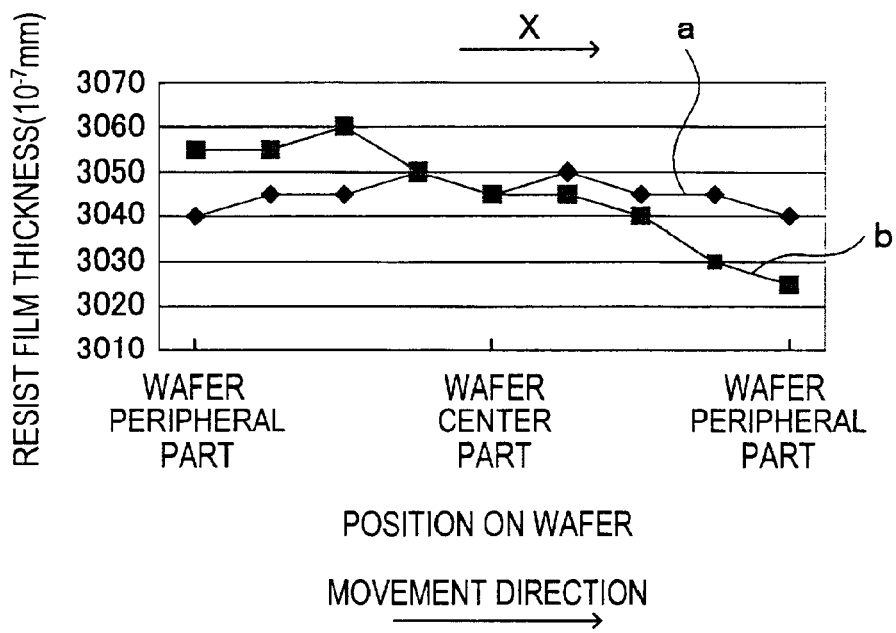
FIG. 10 is a graph showing results of an experiment in which a film thickness of a resist solution on a wafer is measured with a gap between the wafer and the cover changed.

An experiment by the inventor confirms that the film thickness of the resist solution applied on the wafer W becomes more even by providing a widened gap of 4 mm (a line a) between the wafer W and the cover 75 than by providing a gap of 1 mm (a line b) as shown in FIG. 10. More specifically, when the gap between the wafer W and the cover 75 is made 4 mm or more, the resist solution applied on the wafer W becomes unsusceptible to the air current occurring in the gap, so that the flatness of the resist solution is secured. In the above embodiment, the gap between the wafer W and the cover 75 is made 4 mm or more, so that the influence by the air current in the gap occurring when the wafer W is moved in the positive direction of the X-direction is restrained to secure the flatness of the resist solution.

The resist solution immediately after the application has the lowest viscosity because the solvent therein has not evaporated, and thus it is susceptible to the air current and so on. In the above embodiment, the cover 75 on the discharge nozzle 85 side is raised to incline by the cover raising and lowering mechanism 80. Thus, when the wafer W immediately after the application is moved in the X-direction to face the cover 75 for the first time, the gap between the wafer W and the cover 75 is the largest, so that the influence by the air current is restrained to a minimum. Further, since the cover 75 is lowered on the positive direction side in the X-direction where there is little influence exerted upon the resist solution on the wafer W, the gap is narrowed to restrain evaporation of the solvent from the resist solution.

Furthermore, since the inclination of the cover 75 can be adjusted by the cover raising and lowering mechanism 80, it is possible to adjust the width or narrowness of the gap between the cover 75 on the discharge nozzle 85 side and the wafer W. This makes it possible to adjust the gap so as to restrain the influence by the air current while evaporation of the solvent is being restrained. Moreover, it is possible to change the gap as required in accordance with the type of the resist solution, the size of the wafer W, and so on.

Figure 11:
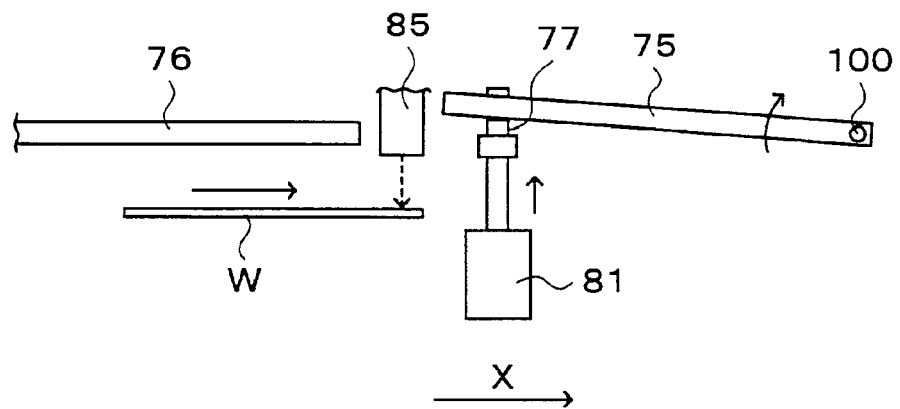
FIG. 11 is a side view schematically showing the inside of the outer container when hinge members are attached to the cover.

While the positive direction side in the X-direction of the cover 75 is supported by the supporting members 78 in the above embodiment, it is also adoptable to attach hinge members 100 to ends of the cover 75 on the positive direction side in the X-direction as shown in FIG. 11. This enables the cover 75 to pivot about the end parts of the cover 75, so that the inclination action of the cover 75 is preferably performed.

Figure 12:
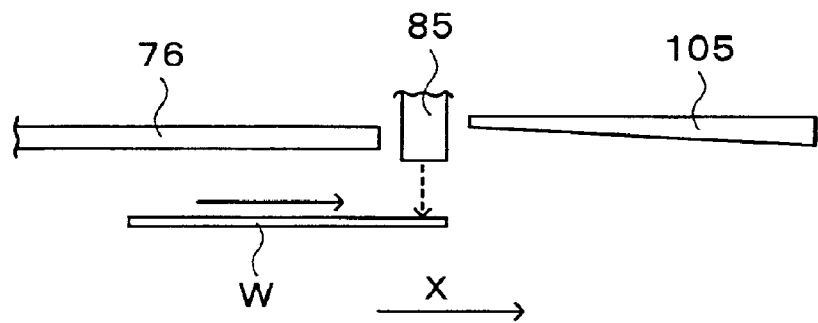
FIG. 12 is a side view schematically showing the inside of the outer container when a cover having another shape is used.

It should be noted that, to incline the cover 75, it is also adoptable to provide the cover 75 at an angle in advance, or to use a cover 105 having a shape with a lower face inclined as shown in FIG. 12.

Moreover, it is preferable that the surface of the lower face of the cover 75 is smooth without projections and depressions. This is because occurrence of a turbulent flow can be prevented further.

Figure 13:
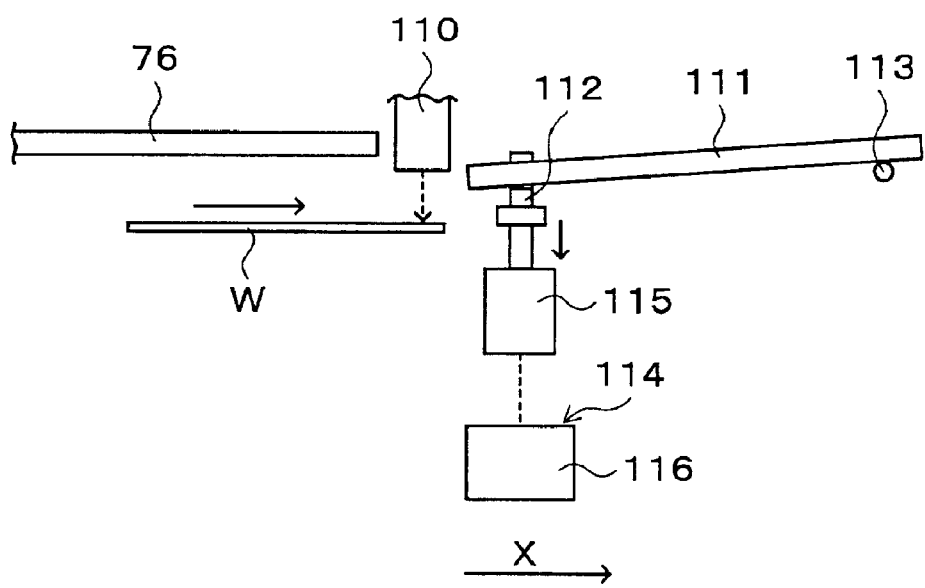
FIG. 13 is an explanatory view schematically showing a configuration of an outer container in a second embodiment.

While the cover 75 is inclined such that the cover 75 is higher on the discharge nozzle 85 side in the above embodiment, the cover 75 may be inclined such that it is lower on the discharge nozzle 85 side. This case is explained as a second embodiment. For example, as shown in FIG. 13, a cover 111 in a flat plate shape is provided on the positive direction side in the X-direction with respect to a discharge nozzle 110 as in the first embodiment. The cover 111 is provided such that when the wafer W is moved to a position under the cover 111, a gap between the cover 111 and the wafer W is 4 mm. The cover 111 is supported by supporting members 112 and 113, and the supporting members 112 which support the negative direction side in the X-direction of the cover 111 are provided with a cover raising and lowering mechanism 114 for lowering the supporting members 112. The cover raising and lowering mechanism 114 is constituted by raising and lowering drivers 115 for supporting the supporting members 112 and freely moving up and down the supporting members 112, and a controller 116 for controlling the raising and lowering drivers 115. Incidentally, the configuration of the other part is the same as that of the first embodiment, and thus the explanation thereof is omitted.

In the coating treatment of the resist solution, the supporting members 112 are lowered by a predetermined distance by the cover raising and lowering mechanism 114 before the start of application to incline the cover 111 so that the cover 111 is lower on the discharge nozzle 110 side. In this event, a gap between the cover 111 and the wafer W is set such that when the wafer W is moved to a position under the cover 111, the gap is about 1 mm on the discharge nozzle 110 side. Thereafter, when the resist solution is applied to the wafer W and the wafer W advances in the positive direction of the X-direction, the wafer W is located under the cover 111 to form a gap of 4 mm between the wafer W and the cover 111. Then, when the wafer W is intermittently moved in the positive direction of the X-direction, an air current having a velocity gradient is formed in the gap. Due to the velocity gradient of the air current, a shearing stress acts on the surface of the resist solution. Then, the shearing stress flattens the resist solution immediately after the application.

As described above, according to the second embodiment, the gap between the wafer W and the cover 111 is positively narrowed so that the resist solution on the wafer W is evened by the shearing stress caused by the air current in the gap to secure the flatness of the resist solution.

Figure 14:
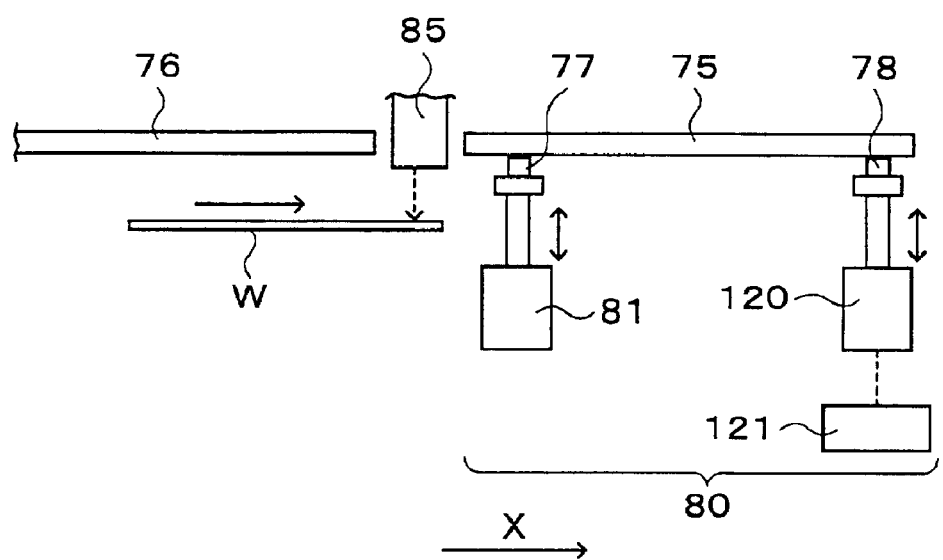
FIG. 14 is an explanatory view schematically showing, from a side, the inside of the outer container when raising and lowering drivers are attached to the cover at two points.

While the raising and lowering drivers for raising and lowering the cover are provided only at the supporting members on the discharge nozzle side in the above embodiment, the raising and lowering drivers may be provided at the supporting members on the positive direction side in the X-direction. For example, the cover raising and lowering mechanism 80 is designed to have raising and lowering drivers 120 for supporting and moving up and down the supporting members 78, and a controller 121 for controlling the raising and lowering drivers 120 as shown in FIG. 14. Further, for example, the supporting members 77 and the supporting members 78 are raised by predetermined distances before the application to incline the cover 75 such that the cover 75 becomes higher on the discharge nozzle 85 side. Thereby, the air current formed between the wafer W and the cover 75 is controlled as in the first embodiment, so that the flatness of the resist solution is secured.

Moreover, in this case, by raising and lowering the supporting members 77 and the supporting members 78 by predetermined distances, the height of the whole cover 75 can also be adjusted. For example, while the supporting members 78 are located to form the gap of 4 mm with the wafer W in the first embodiment, the gap may be made 4 mm or more, or 4 mm or less in comparative consideration of the flatness of the resist solution and the amount of solvent evaporation. This makes it possible to provide a more appropriate gap between the wafer W and the cover 75. Further, the timing of changing the height of the whole cover 75 may be provided during the application of the resist solution. Since, during the application, the cover 75 is inclined and the wafer W is moved, an optimal gap always changes. By changing the gap during the application, the air current in the gap can be controlled more precisely so as to restrain turbulence of the resist solution to a minimum. Incidentally, the above-described case in which the cover is raised and lowered at two points is also applicable to the second embodiment.

Figure 15:
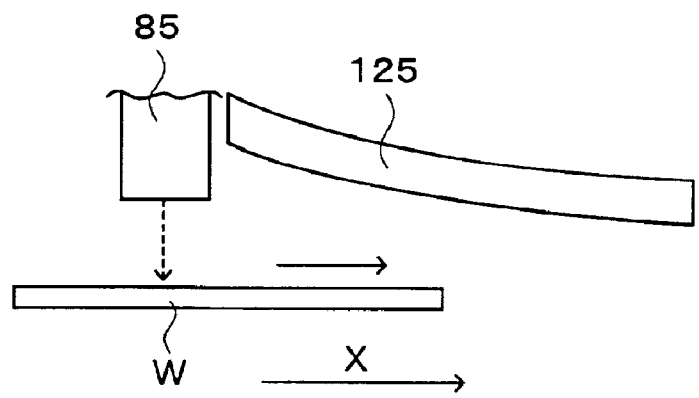
FIG. 15 is an explanatory view showing a configuration example of the inside of the outer container when the cover is formed in a curved shape.

While the cover described in the above embodiments is in a flat plate shape, a cover 125 may be curved protruding downward as shown in FIG. 15. In this case, an air current occurring between the wafer W and the cover 125 smoothly flows to form into a stable air current. This restrains the resist solution on the wafer W from being disturbed by the air current so as to secure the flatness of the resist solution. Incidentally, the cover 125 may be in a curved shape protruding upward.

Next, a cover moving device may be provided which can move the cover 75 in the X-direction and control the movement of the cover 75. Hereinafter, this case is explained as a third embodiment.

Figure 16:
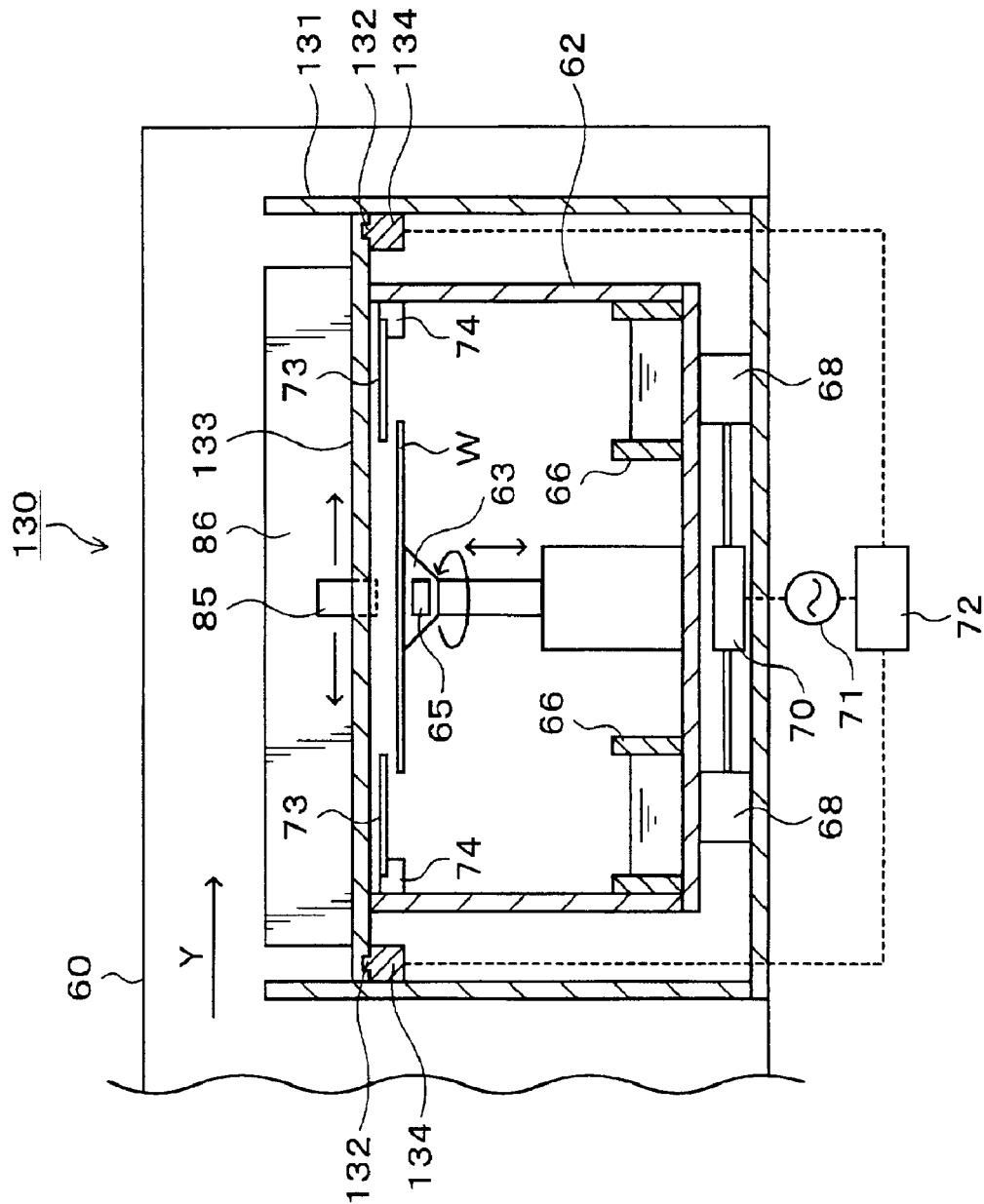
FIG. 16 is an explanatory view of a vertical cross section showing a configuration of a resist coating unit in a third embodiment.
Figure 17:
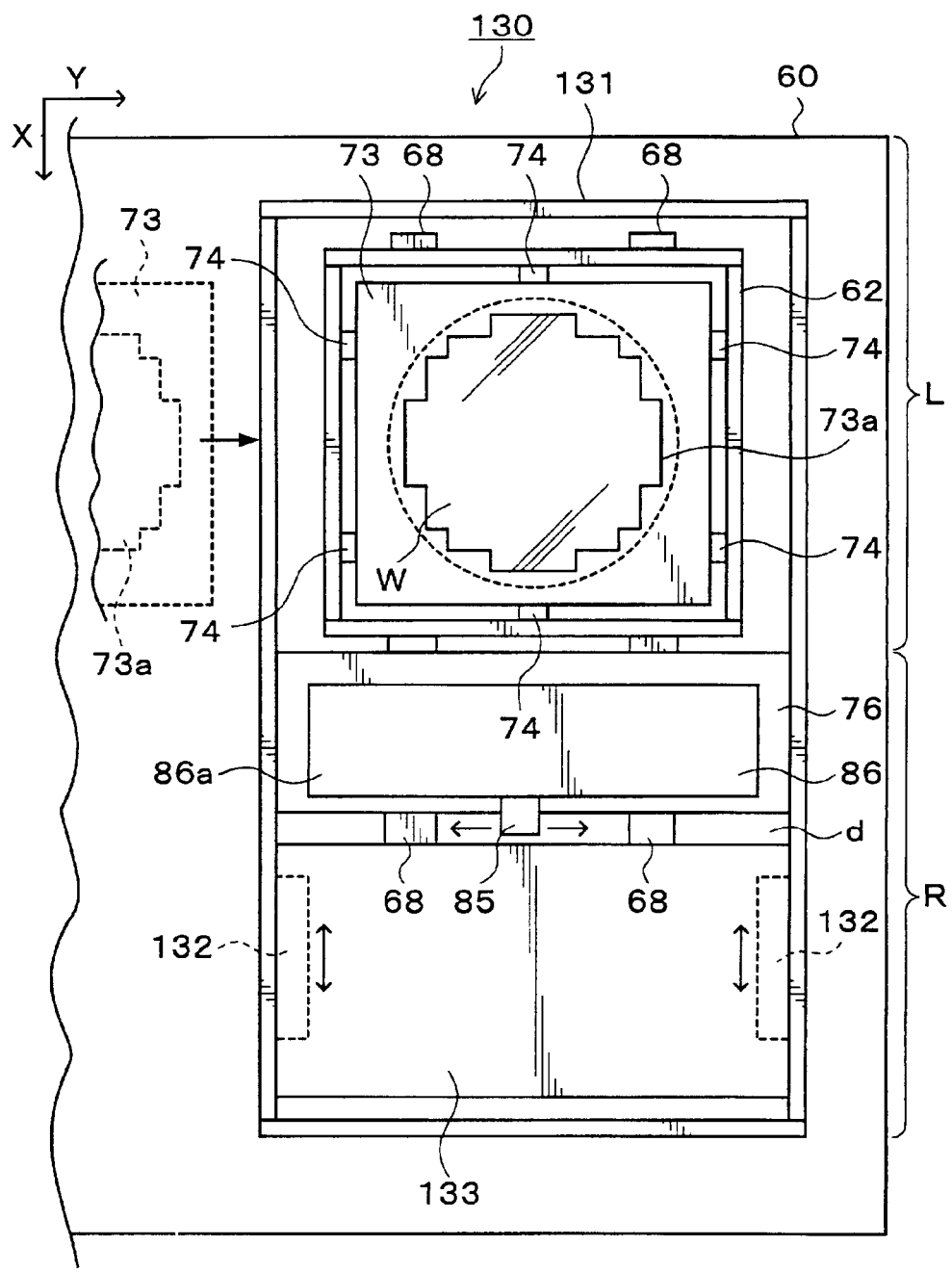
FIG. 17 is an explanatory view of a horizontal cross section of the resist coating unit in FIG. 16.

A resist coating unit 130 in the third embodiment is provided with, for example, rails 132 extending in the X-direction on inner walls of the processing section R side of an outer container 131 as shown in FIG. 16 and FIG. 17. A cover 133 in a flat plate shape is provided to be freely movable along the rails 132. The rail 132 is provided with a cover driver 134 including a motor or the like for moving the cover 133 along the rail 132, and the movement of the cover driver 134 is controlled by the inner container controller 72 for controlling the movement of the inner container 62. The inner container controller 72 can move the inner container 62 and the cover 133 synchronously or individually. As described above, the cover moving device is constituted, for example, by the rails 132, the cover drivers 134, and the inner container controller 72. Incidentally, the configuration of the other part is the same as that of the above-described embodiments, and thus the explanation thereof is omitted.

Next, operations of the resist coating unit 130 of the third embodiment are explained. A wafer W carried in the resist coating unit 130 is held by the holder 63 in the inner container 62 and moved to a position, where application is started, by the movement of the inner container 62. Then, when the application of the resist solution is started, the discharge nozzle 85 first moves in the positive direction of the Y-direction from the start position S and discharges the resist solution onto the wafer W. When the discharge nozzle 85 reaches the outside of the wafer W on the negative direction side in the Y-direction, the discharge nozzle 85 is once stopped there.

Figure 18:
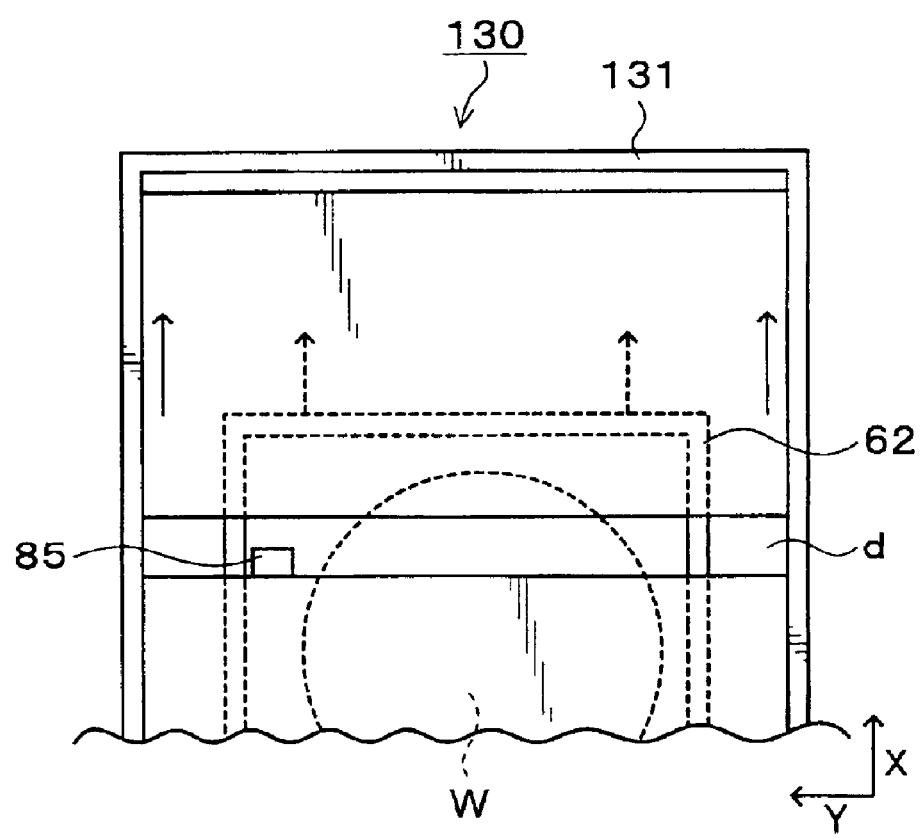
FIG. 18 is a schematic plane view of an outer container for explaining operations of the resist coating unit in the third embodiment.
Figure 19:
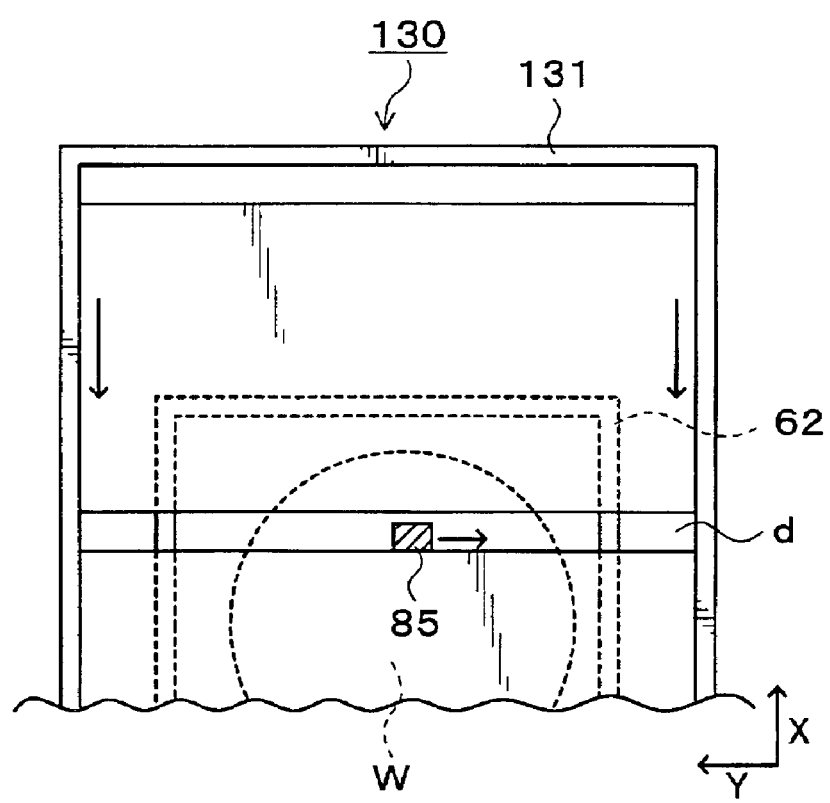
FIG. 19 is a schematic plane view of the outer container for explaining the operations of the resist coating unit in the third embodiment.

Then, the inner container 62 moves by a predetermined distance in the positive direction of the X-direction, whereby a coating position of the wafer W is shifted. In this event, the cover 133 is moved in the positive direction of the X-direction by the same distance as that of the inner container 62 in synchronization therewith as shown in FIG. 18. Subsequently, the discharge nozzle 85 moves in the negative direction of the Y-direction and discharges the resist solution onto the wafer W. In this event, as shown in FIG. 19, the cover 133 is returned to its original position slowly, for example, at a speed lower than that when it moves in the positive direction of the X-direction.

When the discharge nozzle 85 reaches the outside of the wafer W, the discharge nozzle 85 is stopped, and the inner container 62 is moved by a predetermined distance in the positive direction of the X-direction to be shifted. In this event, the cover 133 is also moved in the positive direction of the X-direction in synchronization with the wafer W as in the aforesaid case. Then, when the discharge nozzle 85 again moves in the positive direction of the Y-direction, the cover 133 is returned to the original position.

As described above, when the inner container 62 shifts in the positive direction of the X-direction, the cover 133 is designed to similarly move in the positive direction of the X-direction, and thereafter the cover 133 is designed to return to the original position while the discharge nozzle 85 is moving in the Y-direction and discharging the resist solution. This makes it possible to decrease the velocity gradient of an air current formed between the wafer W and the cover 133 when the wafer W is moved in the positive direction of the X-direction so as to decrease a shearing stress exerted upon the surface of the resist solution. Further, since the cover 133 is slowly returned to the original position while the discharge nozzle 85 is moving in the Y-direction, the solvent in the resist solution can be restrained from evaporating from the wafer W due to a widened gap d. Furthermore, the cover 133 is returned at a low speed, which prevents an air current having a large velocity gradient from being formed by the movement in returning, and exerting adverse influence upon the resist solution.

Meanwhile, the coating solution such as the resist solution applied on the wafer W moves more easily as its film thickness increases. Further, as the cover 75 is located closer to the wafer W, the cover 75 can restrain more greatly the evaporation of the solution on the wafer W to restrain occurrence of turbulence increasingly. Thus, it is preferable to keep more distance between the cover 75 and the surface of the wafer W the larger the film thickness is, and to keep the cover 75 closer to the surface of wafer W the smaller the film thickness is.

Therefore, a degree of moving up and down the supporting members 77 is inputted in advance into the controller 82 for controlling the actions of the raising and lowering drivers 81 based on a film thickness to be applied on the surface of the wafer W, which makes it possible to preferably control a degree of approaching/retracting of the cover 75 to/from the surface of the wafer W based on the film thickness.

Figure 20:
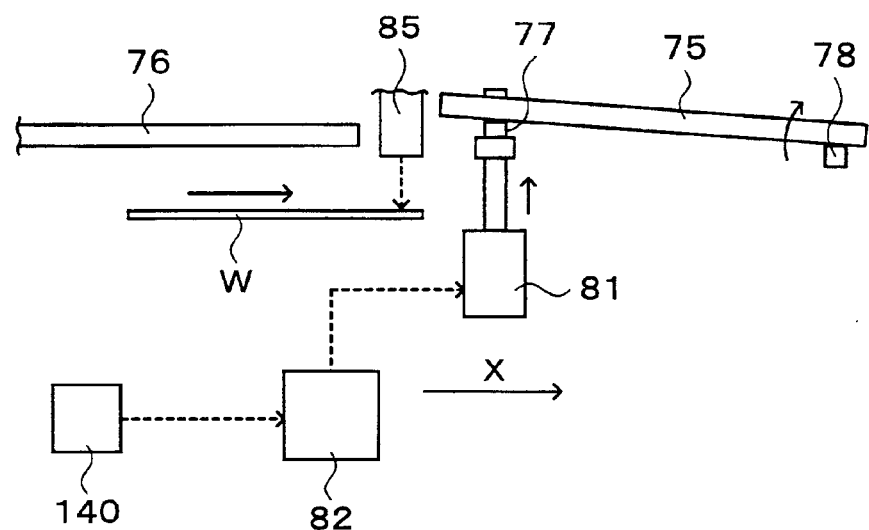
FIG. 20 is an explanatory view of an example including an input device of a film thickness into a controller.

In this case, as shown in FIG. 20, an input device 140 for inputting the film thickness into the controller 82 is connected to the controller 82, while the controller 82 is provided with a memory storing, in advance, the relationship between a film thickness and a preferable degree of approaching/retracting of the cover to/from the wafer W corresponding to the film thickness. The above configuration is employed, so that, based on film thickness information inputted from the input device 140, the controller 82 selects an optimal degree of approaching/retracting of the cover 75 corresponding to the film thickness registered in the memory, and outputs it to the raising and lowering drivers 81. Based on this, the raising and lowering drivers 81 cause the cover 75 to approach and retract. This is also effective in the examples shown in FIGS. 11, 13, and 14.

Figure 21:
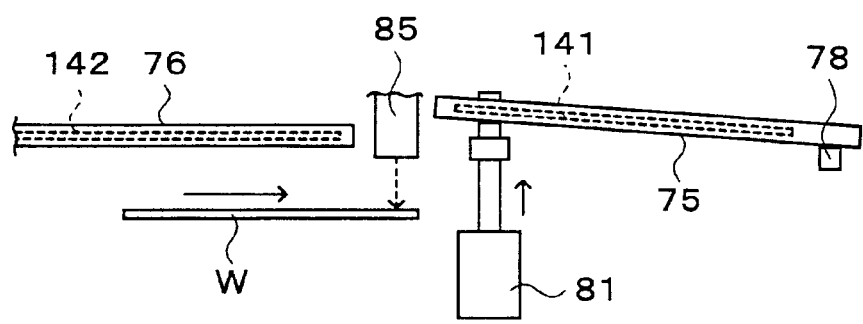
FIG. 21 is an explanatory view of a cover having a temperature regulator therein.

Meanwhile, evaporation from the coating film such as a resist film or the like applied on the wafer W is influenced by temperature. Regarding this point, for example, a temperature regulator 141 may be accommodated inside the cover 75 as shown in FIG. 21 to control the temperature of the cover 75, particularly the temperature of the lower face of the cover 75.

The temperature regulator 141 itself can employ a well-known technique such as a flow passage through which, for example, a cooling water flows, a Peltier element, a heat pipe, or the like.

Further, a range of temperature control is preferably, for example, from 10° C. to 23° C. This is because a temperature below 10° C. might cause condensation on the surface of the cover 75, and a temperature above 23° C. might contrarily promote evaporation from the applied solution. Thus, the temperature of the cover 75 is controlled in the aforementioned range, which can restrain evaporation from the coating film on the surface of the wafer W, resulting in restraint of occurrence of an air current.

As for the material of the cover 75, a material having good heat conductivity is suitable such as stainless steel, aluminum, or the like, but resin or silica glass is not so suitable.

It should be noted that as for the cover 76 covering the wafer W, a temperature regulator 142 may be accommodated therein in the same manner.

The above-described embodiments are applied to the coating unit for applying the resist solution onto the wafer, and the present invention is also applicable to a coating unit for applying another coating solution to form an insulating film or the like, for example, a coating unit for forming an SOD or SOG film or the like. Furthermore, the above-described embodiments are applied to the coating unit in the photolithography process of the semiconductor wafer device fabrication processes, and the present invention can also be applied to a coating unit for a substrate other than the semiconductor wafer, for example, an LCD substrate.

According to the present invention, since the flatness of a coating solution can be secured by controlling an air current occurring between a substrate and a cover, a uniform coating film having a predetermined thickness is formed on the substrate, resulting in improved yield.

What is claimed is:

1. A coating unit for applying a coating solution to a substrate, comprising:
   a discharge nozzle for reciprocating in a predetermined direction above said substrate and discharging said coating solution to said substrate;
   a holder for holding said substrate and horizontally movable in one direction perpendicular to said predetermined direction;
   a cover for covering an upper face of said substrate; and
   a cover moving device for moving said cover in a direction perpendicular to said predetermined direction.

2. A coating unit as set forth in claim 1, wherein said lower face of said cover is curved.

3. A coating unit as set forth in claim 1, further comprising:
   a cover raising and lowering mechanism for raising and lowering a part of said cover, wherein said cover has a flat plate shape with a uniform thickness.

4. A coating unit as set forth in claim 3, wherein said cover raising and lowering mechanism raises and lowers portions in vicinities of both ends along said one direction of said cover.

5. A coating unit as set forth in claim 3, further comprising:
   a controller for controlling a degree of raising and lowering by said cover raising and lowering mechanism based on a film thickness of said coating solution on said substrate.

6. A coating unit as set forth in claim 5, wherein a temperature of said cover is adjusted in a range of 10° C. to 23° C.

7. A coating unit as set forth in claim 1, wherein a temperature of said cover is adjustable.

8. A coating unit as set forth in claim 1, wherein a flow passage for a cooling water is formed in said cover.

9. A coating unit as set forth in claim 1, wherein a Peltier element is accommodated in said cover.

10. A coating unit as set forth in claim 1, wherein a heat pipe device is accommodated in said cover.

11. A coating unit as set forth in claim 1, wherein a surface of said lower face of said cover is smooth without projections and depressions.

12. A coating unit for applying a coating solution to a substrate, comprising:
    a discharge nozzle for reciprocating in a predetermined direction above said substrate and discharging said coating solution to said substrate;
    a holder for holding said substrate and horizontally movable in one direction perpendicular to said predetermined direction;
    at least two covers for covering an upper face of said substrate; and
    a cover moving device for moving one of said covers vertically, wherein said at least two covers are located front side and back side of the substrate along said one direction, respectively, and the cover located front side is movable up and down by said cover moving device.

13. The coating unit as set forth in claim 12, wherein said at least two covers are separated from each other by a gap within which said discharging nozzle reciprocates above said substrate.

* * * * *